(12) United States Patent
Lee (10) Patent No.: US 7,548,478 B2
(45) Date of Patent: *Jun. 16, 2009

(54) CIRCUIT AND METHOD FOR SELECTING TEST SELF-REFRESH PERIOD OF SEMICONDUCTOR MEMORY DEVICE

(75) Inventor: Kyong-Ha Lee, Ichon-shi (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/976,356

(22) Filed: Oct. 24, 2007

(65) Prior Publication Data

US 2008/0062799 A1 Mar. 13, 2008

Related U.S. Application Data

(63) Continuation of application No. 11/320,650, filed on Dec. 30, 2005, now Pat. No. 7,301,841.

(30) Foreign Application Priority Data

Mar. 31, 2005 (KR) .................. 10-2005-0027352

(51) Int. Cl.
G11C 7/00 (2006.01)
(52) U.S. Cl. ...................... 365/222; 365/196
(58) Field of Classification Search ................ 365/222, 365/196

See application file for complete search history.

(56) References Cited

U.S. PATENT DOCUMENTS

| 5,532,968 | A | 7/1996 | Lee |
|---|---|---|---|
| 5,844,914 | A | 12/1998 | Kim et al. |
| 6,597,614 | B2 | 7/2003 | Nam et al. |
| 6,707,745 | B2 | 3/2004 | Mizugaki |
| 6,731,560 | B2 | 5/2004 | Yoon et al. |
| 6,779,136 | B2 | 8/2004 | Richter et al. |
| 6,862,240 | B2 | 3/2005 | Burgan |
| 7,034,507 | B2 | 4/2006 | Lovett |
| 2004/0090853 | A1 | 5/2004 | Perner |
| 2005/0212613 | A1* | 9/2005 | Hashimoto .................. 331/176 |

FOREIGN PATENT DOCUMENTS

| JP | 64-69800 | 3/1989 |
|---|---|---|
| JP | 10-069800 | 3/1998 |
| KR | 10-2004-0092747 | 11/2004 |

\* cited by examiner

*Primary Examiner*—Connie C Yoha
(74) *Attorney, Agent, or Firm*—Mannava & Kang P.C.

(57) ABSTRACT

The present invention provides a self-refresh period adaptable for testing cells that are weak against hot temperature stress. An apparatus for controlling a self-refresh operation in a semiconductor memory device includes a first period selector for generating one of a period-fixed pulse signal having a constant period and a period-variable pulse signal having a variable period based on a temperature of the semiconductor memory device in a test mode; and a self-refresh block for performing the self-refresh operation in response to an output of the first period selector.

15 Claims, 8 Drawing Sheets

CIRCUIT AND METHOD FOR SELECTING TEST SELF-REFRESH PERIOD OF SEMICONDUCTOR MEMORY DEVICE

RELATED APPLICATIONS

This application is a Continuation of U.S. application Ser. No. 11/320,650, filed Dec. 30, 2005 now U.S. Pat. No. 7,301,841, claiming priority of Korean Application No. 10-2005-0027352, filed Mar. 31, 2005, the entire contents of each of which are hereby incorporated by reference.

FIELD OF THE INVENTION

The present invention relates to a semiconductor memory device; and, more particularly, to a technique for automatically changing a refresh period in a semiconductor memory device or pseudo SRAM, depending on temperature.

DESCRIPTION OF RELATED ART

Figure 1:
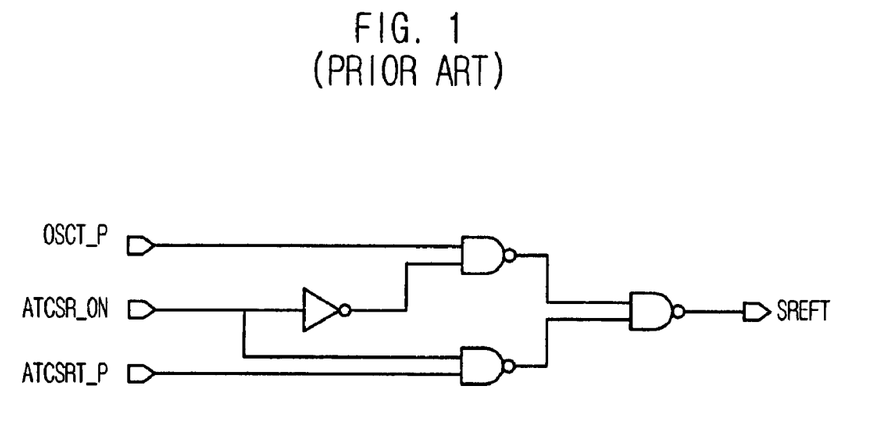
FIG. 1 is a circuit diagram of a conventional self-refresh period selecting circuit.

FIG. 1 is a circuit diagram of a conventional self-refresh period selecting circuit.

Referring to FIG. 1, the conventional self-refresh period selecting circuit outputs a period-fixed pulse signal OSCT_P having a constant period regardless of temperature change, or outputs a period-variable pulse signal ATCSR_P, a period of which is varied depending on temperature change outputted from an auto temperature compensated self-refresh circuit (not shown) by using a period selection signal ATCSR_ON. That is, the period-variable pulse signal ATCSR_P is outputted depending on the high-active period selection signal ATCSR_ON. The conventional linear auto temperature compensated self-refresh is designed such that its period is linearly varied with the increase of temperature. Consequently, the refresh period decreases as the temperature increases.

If the period selection signal ATCSR_ON is in a high state, the period-variable pulse signal ATCSR_P is outputted. Therefore, even though the temperature increases, a DRAM cell can be refreshed more frequently, so that it is advantageous in terms of the refresh. However, it is difficult to test the performance of cells that are weak against hot temperature.

SUMMARY OF THE INVENTION

It is, therefore, an object of the present invention to provide a self-refresh period adaptable for testing cells that are weak against hot temperature stress.

In accordance with an aspect of the present invention, there is provided an apparatus for controlling a self-refresh operation in a semiconductor memory device, including a first period selector for generating one of a period-fixed pulse signal having a constant period and a period-variable pulse signal having a variable period based on a temperature of the semiconductor memory device in a test mode; and a self-refresh block for performing the self-refresh operation in response to an output of the first period selector.

In accordance with another aspect of the present invention, there is provided a semiconductor memory device for controlling a self-refresh operation, including a period comparator for outputting a period comparison signal that maintains an enable state until a period-fixed pulse signal is outputted from an entrance into a self-refresh mode; a hot temperature stop controller for combining a period-variable pulse signal having a variable period depending on temperature and the period comparison signal, and generating a hot temperature stop signal when the period-variable pulse signal is generated during an enable period of the period comparison signal, and generating a delayed hot temperature stop signal; a second period-fixed pulse generator for generating a second period-fixed pulse signal in which the period-fixed pulse signal generated just after the enable period of the period comparison signal is removed; a first period selector for generating one of a period-fixed pulse signal having a constant period and a period-variable pulse signal having a variable period based on the delayed hot temperature stop signal in a test mode; and a self-refresh block for performing the self-refresh operation in response to an output of the first period selector.

In accordance with a further another aspect of the present invention, there is provided a method for controlling a self-refresh operation in a semiconductor memory device, including the steps of generating one of a period-fixed pulse signal having a constant period and a period-variable pulse signal having a variable period based on a temperature of the semiconductor memory device in a test mode; and performing the self-refresh operation in response to an output of the first period selector.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

An apparatus for controlling a self-refresh operation in a semiconductor memory device according to an embodiment of the present invention includes a first period selector for generating one of a period-fixed pulse signal having a constant period and a period-variable pulse signal having a variable period based on a temperature of the semiconductor memory device in a test mode; and a self-refresh block for performing the self-refresh operation in response to an output of the first period selector.

Figure 2:
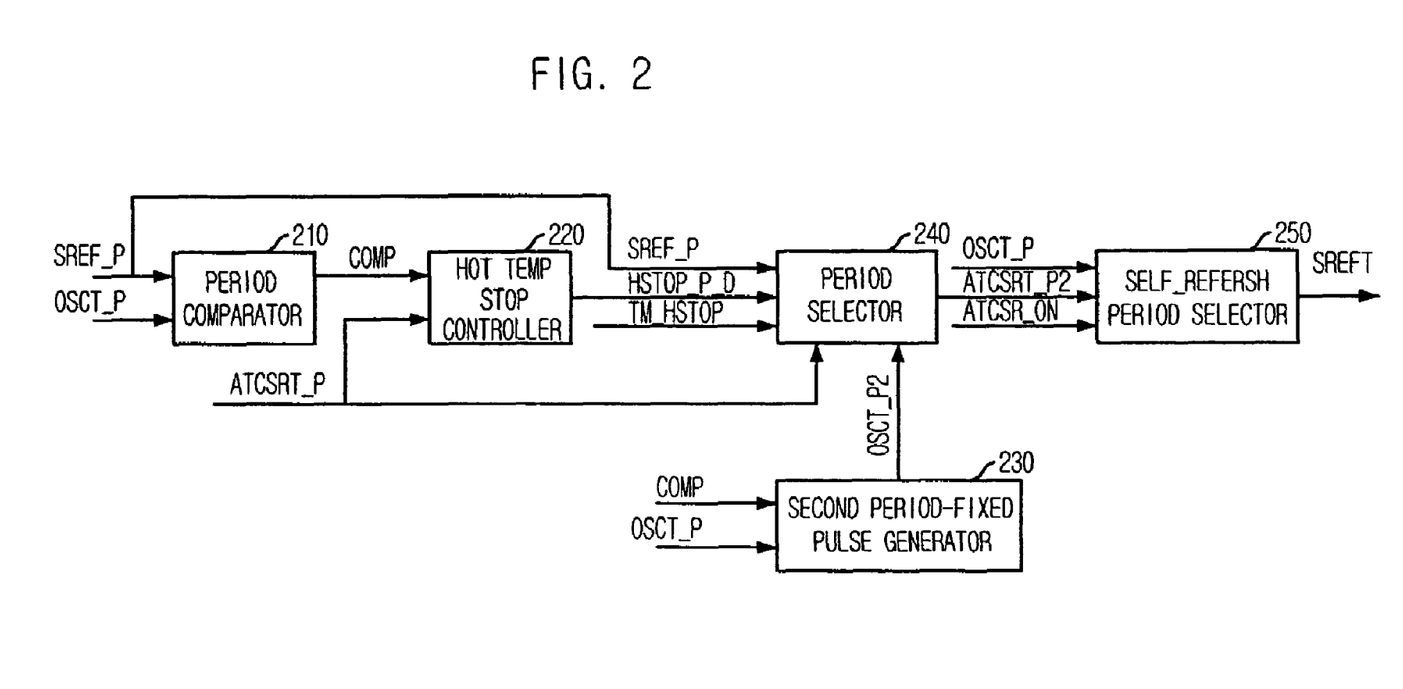
FIG. 2 is a block diagram of a circuit for selecting a test self-refresh period in accordance with an embodiment of the present invention.

FIG. 2 is a circuit diagram of a test self-refresh period selecting circuit in accordance with an embodiment of the present invention.

As shown, the test self-refresh period selecting circuit includes a period comparator 210, a hot temperature stop controller 220, a second period-fixed pulse generator 230, a period selector 240, and a self-refresh period selector 250.

Figure 3:
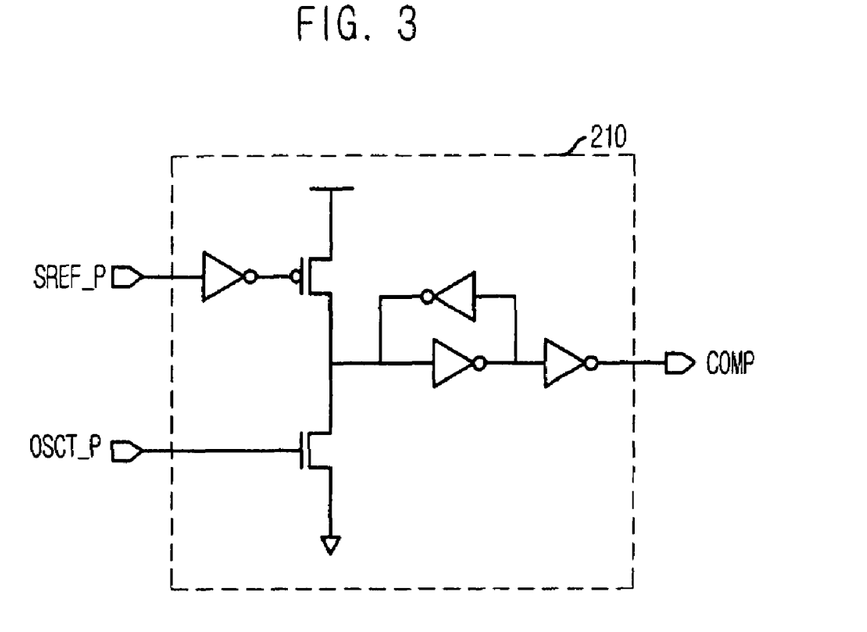
FIG. 3 is a detailed circuit diagram of a period comparator shown in FIG. 2.

The period comparator 210 outputs a period comparison signal COMP by combining a self-refresh identifying signal SREF_P and a period-fixed pulse signal OSCT_P. The self-refresh identifying signal SREF_P notifies an entrance into a self-refresh mode. That is, as shown in FIG. 3, the period comparator 210 outputs the period comparison signal COMP that maintains a high level until a first period-fixed pulse signal OSCT_P is outputted from the entrance into the self-refresh mode.

The hot temperature stop controller 220 combines the period-variable pulse signal ATCSR_P and the period comparison signal COMP and checks whether or not the period-variable pulse signal ATCSR_P is generated during an enable period of the period comparison signal COMP.

Figure 4:
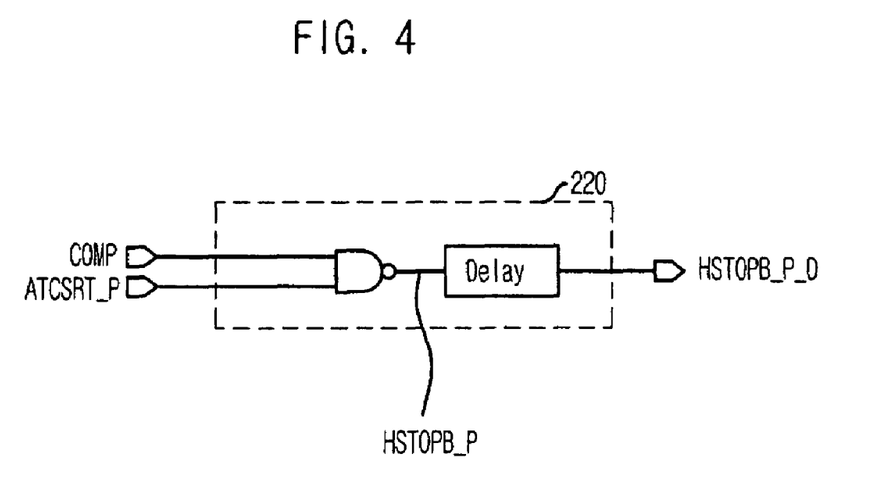
FIG. 4 is a detailed circuit diagram of a hot temperature stop controller shown in FIG. 2.

That is, as shown in FIG. 4, the hot temperature stop controller 220 detects the period-variable pulse signal ATCSR_P while the period comparison signal COMP is in the high level, and then generates a hot temperature stop signal HSTOP_P. The hot temperature stop controller 220 can include a delay unit that delays the hot-temperature stop signal HSTOP_P by a predetermined time, thereby generating a delayed hot temperature stop signal HSTOP_P_D. The delay unit is used to generate a second pulse after passing through a period where the period-variable pulse signal ATCSR_P is in the high state. If the delay is not provided, two test self-refresh signals SREFT may be generated from the test self-refresh period selecting circuit.

The second period-fixed pulse generator 230 outputs a second period-fixed pulse signal OSCT_P2 in which the period-fixed pulse signal generated just after the enable period of the period comparison signal COMP is removed.

Figure 5:
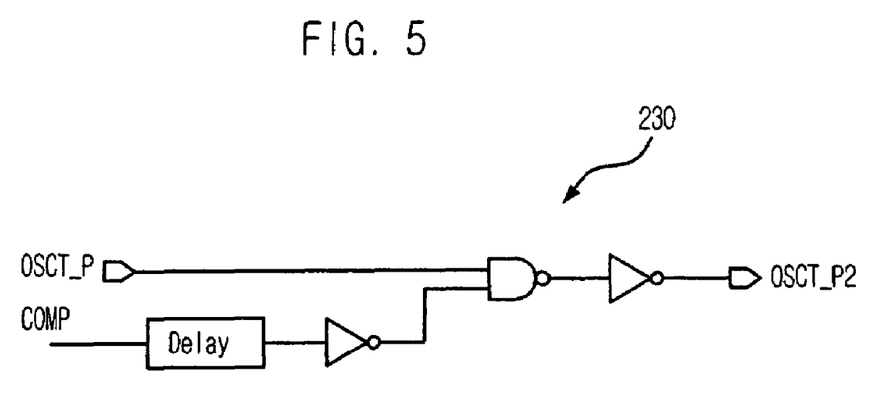
FIG. 5 is a detailed circuit diagram of a second period-fixing pulse signal generator shown in FIG. 2.

Referring to FIG. 5, the second period-fixed pulse generator 230 performs a logical AND operation on a delayed and inverted period comparison signal COMP and the period-fixed pulse signal OSCT P to output a second period-fixed pulse signal OSCT P2. When the period-variable pulse signal ATCSR P is shorter than the period-fixed pulse signal OSCT_P, the period-variable pulse signal ATCSR_P is generated during the enable period of the period comparison signal COMP. Therefore, when the period comparison signal COMP is disabled, the period-fixed pulse signal OSCT_P has to be generated. At this time, if the signal generated by delaying the period comparison signal COMP by a predetermined time is not blocked, two test self-refresh signals SREFT may be generated from the test self-refresh period selecting circuit.

The period-variable pulse signal ATCSR_P generated during the enable period of the period comparison signal COMP cannot be blocked. Therefore, by removing the period-fixed pulse signal OSCT P generated just after the enable period of the period comparison signal COMP, the generation of two test self-refresh signals SREFT can be prevented.

Figure 6:
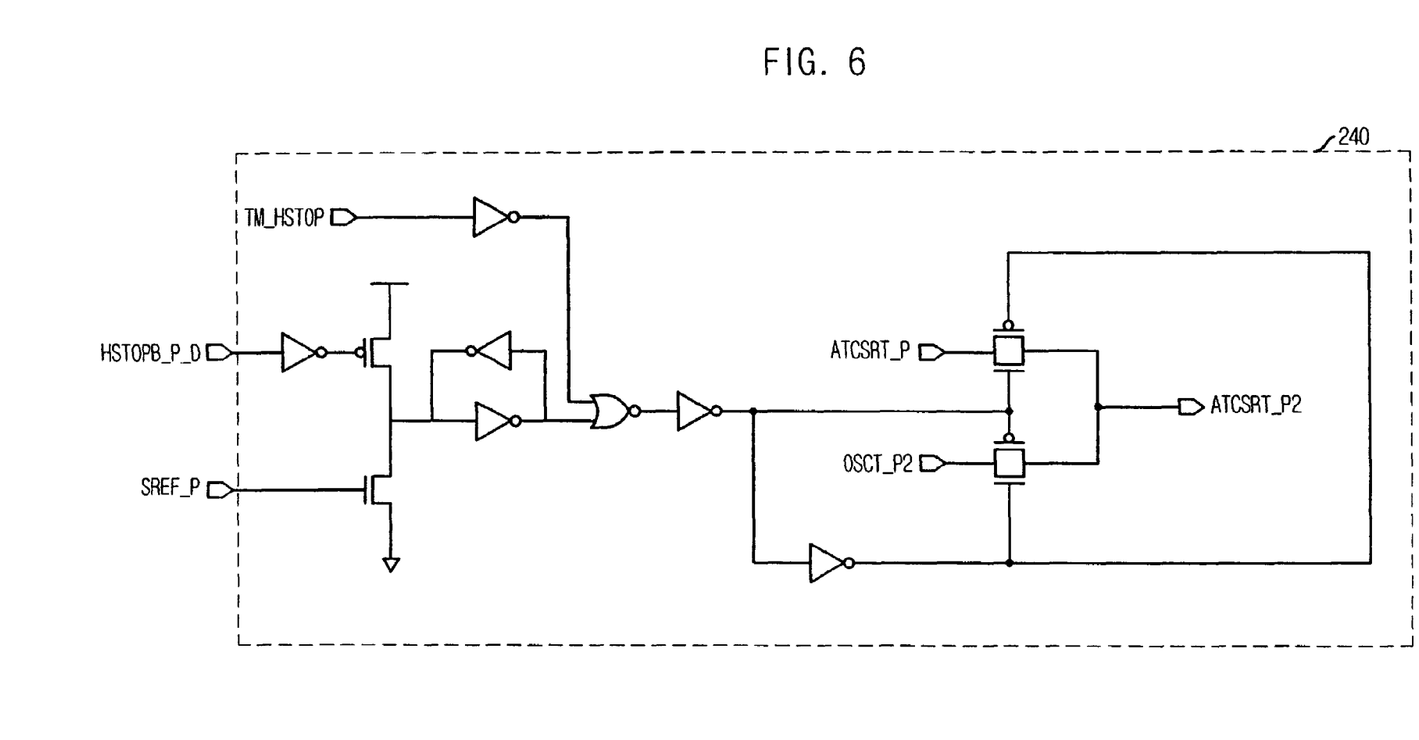
FIG. 6 is a detailed circuit diagram of a period selector shown in FIG. 2.

Referring to FIG. 6, the period selector 240 outputs the second period-fixed pulse signal OSCT_P2 as the period select signal ATCSRT_P2 when the delayed hot temperature stop signal HSTOP_P_D is generated, and outputs the period-variable pulse signal ATCSRT_P as the period select signal when the delayed hot temperature stop signal HSTOP_P_D is not generated. In addition, this operation is performed only when the test mode signal TM_HSTOP is enabled to a high level.

Figure 7:
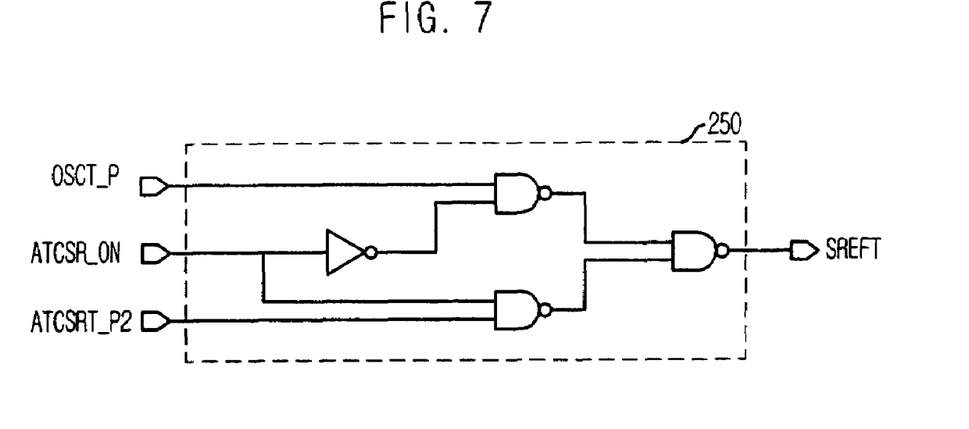
FIG. 7 is a circuit diagram of a self-refresh period selector shown in FIG. 2.

Referring to FIG. 7, the self-refresh period selector 250 outputs the period-fixed pulse signal OSCT_P having a constant period regardless of temperature change, or outputs the period selection signal ATCSR_P2 when the period selection signal ATCSR ON is enabled.

Figure 8:
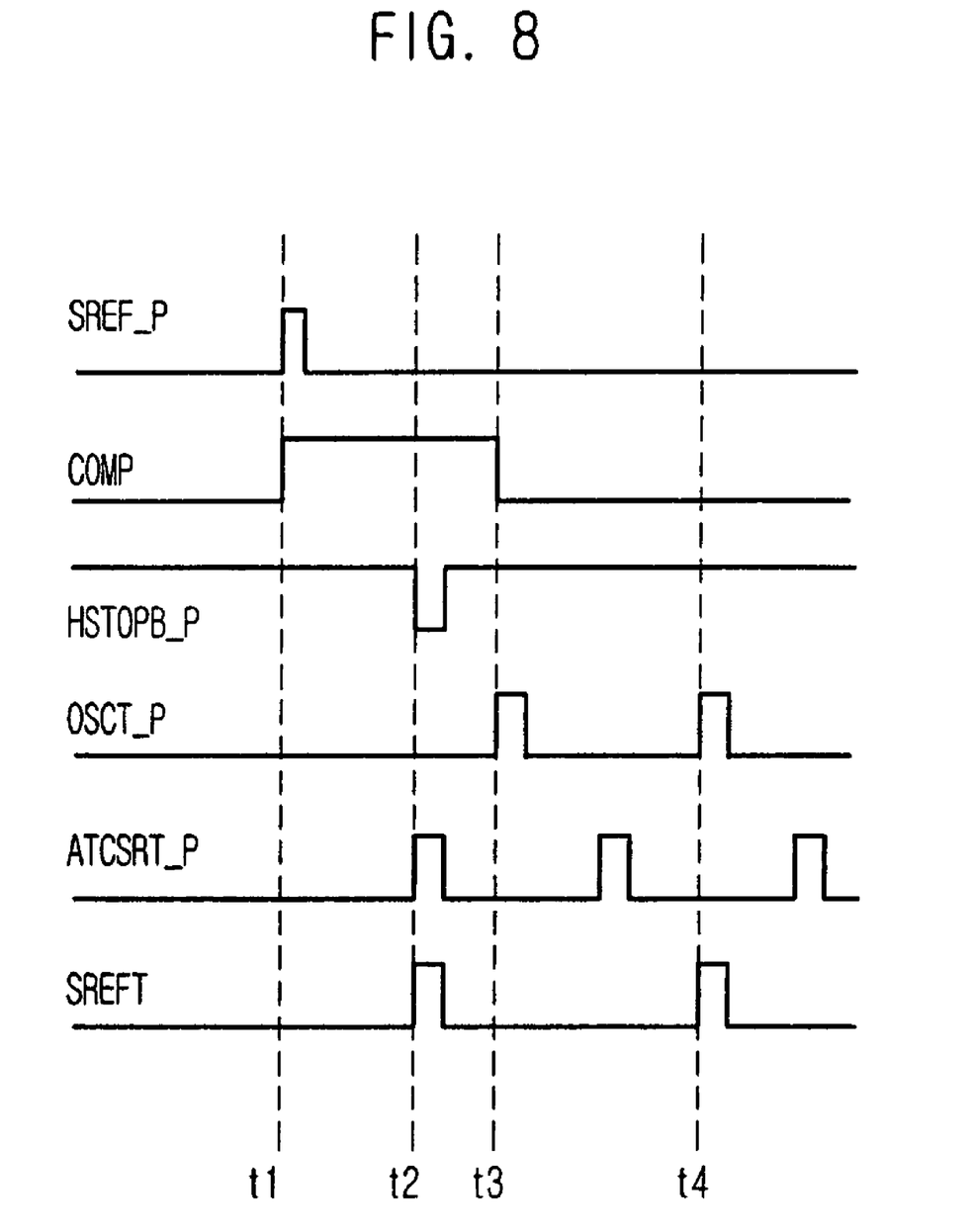
FIG. 8 is a timing diagram illustrating a case where a period of a period-variable pulse signal is shorter than a period of a period-fixed pulse signal.

FIG. 8 is a flowchart illustrating a case where a period of the period-variable pulse signal is shorter than the period of the period-fixed pulse signal.

At t1, if the self-refresh identifying signal SREF_P is enabled, the period comparison signal COMP is enabled to a high level. At t3, if the first period-fixed pulse signal OSCT_P is outputted, the period comparison signal COMP is disabled to a low level and thus the enable period of the comparison signal COMP is set. Meanwhile, if the period-variable pulse signal ATCSRT_P is generated within the enable period of the period comparison signal COMP, the top temperature stop signal HSTOPB_P is outputted. At t4, the period-fixed pulse signal OSCT_P is outputted from the test self-refresh period selector. That is, the test self-refresh period selector outputs the period-fixed pulse signal OSCT_P when the temperature of the semiconductor memory device increases more than a predetermined degree.

Figure 9:
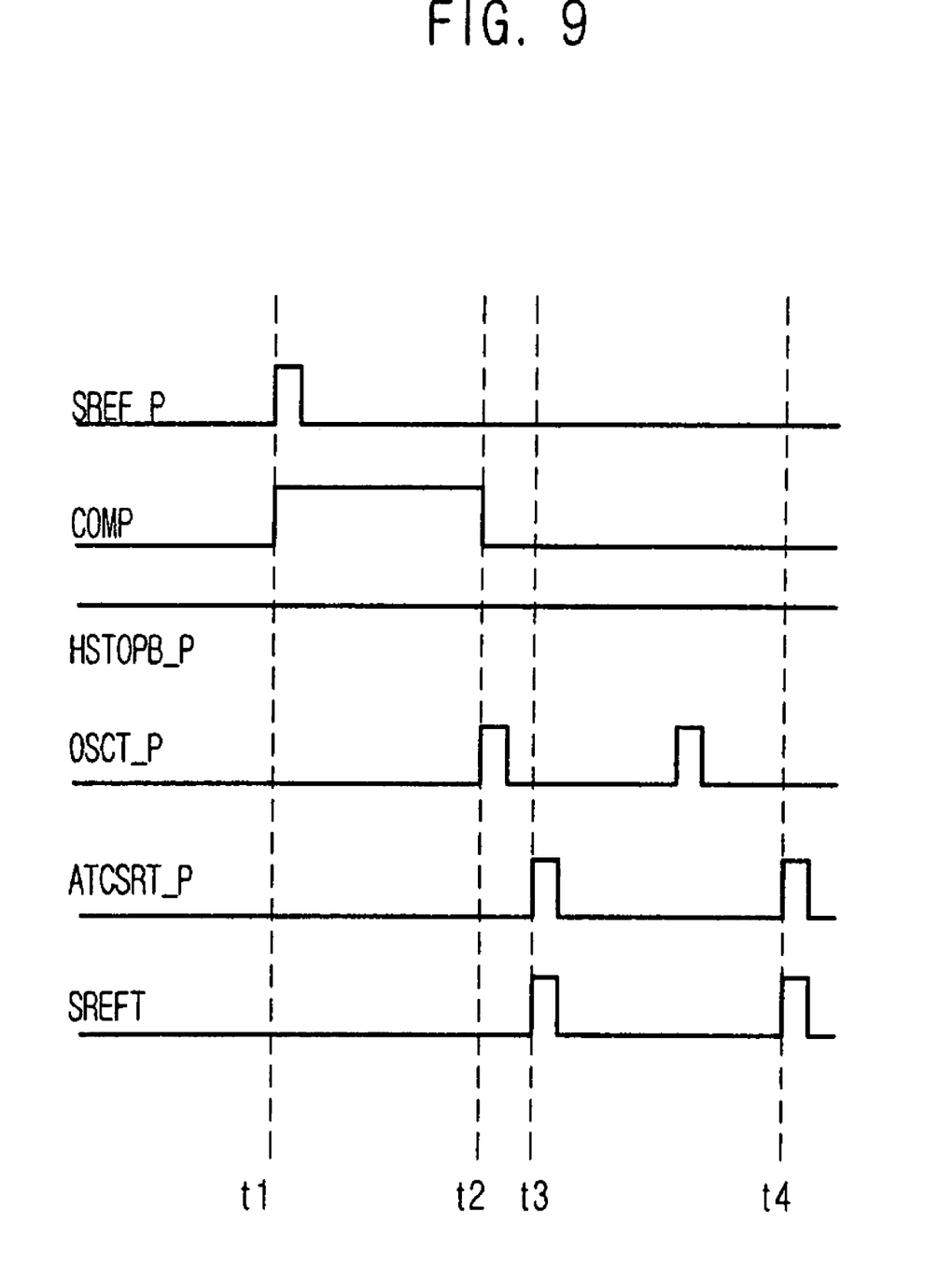
FIG. 9 is a timing diagram illustrating a case where a period of a period-variable pulse signal is longer than a period of a period-fixed pulse signal.

FIG. 9 is a timing diagram illustrating a case where the period of the period-variable pulse signal is longer than the period of the period-fixed pulse signal.

An operation of setting the enable period of the period comparison signal COMP is identical to that in FIG. 8. However, since the period of the period-variable pulse signal ATCSRT_P is longer than that of the period-fixed pulse signal OSCT_P, the hot temperature stop signal HSTOPB_P is not generated. Accordingly, the period-variable pulse signal ATCSRT_P is also outputted at t3 and t4. That is, the test self-refresh period selector outputs the period-variable pulse signal ATCSRT_P when the temperature of the semiconductor memory device is below the predetermined degree.

The present application contains subject matter related to Korean patent application No. 2005-0027352, filed in the Korean Intellectual Property Office on Mar. 31, 2005, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. An apparatus for controlling a self-refresh operation in a semiconductor memory device, comprising:
    a first period selector for outputting a period-fixed pulse signal having a constant period when a temperature of the semiconductor memory device increases more than a predetermined degree and outputting a period-variable pulse signal having a variable period based on the temperature when the temperature is below the predetermined degree in a test mode; and
    a second period selector for outputting one of the period-variable pulse signal and the period-fixed pulse signal according to a operating option in a test exit mode.

2. The apparatus as recited in claim 1, further comprising a self-refresh block for performing the self-refresh operation in response to an output of the first and second period selectors.

3. The apparatus as recited in claim 1, wherein the second period selector outputs the period-variable pulse signal when a self-refresh period is intended to automatically change depending on the temperature of semiconductor memory device.

4. The apparatus as recited in claim 3, wherein a period of the period-variable pulse signal is in proportion to the temperature of the semiconductor memory device.

5. The apparatus as recited in claim 3, wherein a period of the period-variable pulse signal is in inversely proportion to the temperature of the semiconductor memory device.

6. An apparatus for controlling a self-refresh operation in a semiconductor memory device, comprising:
   a first period selector for outputting one of a period-fixed pulse signal having a constant period and a period-variable pulse signal having a variable period based on a temperature of the semiconductor memory device,
   wherein the first period selector outputs the period-fixed pulse signal when the temperature of the semiconductor memory device increases more than a predetermined degree in a test mode.

7. The apparatus as recited in claim 6, further comprising a self-refresh block for performing the self-refresh operation in response to an output of the first period selector.

8. The apparatus as recited in claim 7, further comprising a second period selector for outputting one of the period-variable pulse signal and the period-fixed pulse signal into the self-refresh block according to an operating option in a test exit mode.

9. The apparatus as recited in claim 8, wherein the second period selector outputs the period-variable pulse signal when a self-refresh period is intended to automatically change depending on the temperature of semiconductor memory device.

10. The apparatus as recited in claim 9, wherein a period of the period-variable pulse signal is in proportion to the temperature of the semiconductor memory device.

11. The apparatus as recited in claim 9, wherein a period of the period-variable pulse signal is in inversely proportion to the temperature of the semiconductor memory device.

12. The apparatus as recited in claim 6, wherein the first period selector outputs the period-variable pulse signal when the temperature of the semiconductor memory device is below the predetermined degree.

13. An apparatus for controlling a self-refresh operation in a semiconductor memory device, comprising:
   a first period selector for outputting one of a period-fixed pulse signal having a constant period and a period-variable pulse signal having a variable period based on a temperature of the semiconductor memory device in a test made;
   a second period selector for outputting one of the period-variable pulse signal and the period-fixed pulse signal according to an operating option in a test exit mode, and
   a self-refresh block for performing the self refresh operation in response to outputs of the first and second period selector.

14. The apparatus as recited in claim 13, wherein the first period selector outputs a period-fixed pulse signal having a constant period when a temperature of the semiconductor memory device increases more than a predetermined degree and outputs a period-variable pulse signal having a variable period based on the temperature when the temperature is below the predetermined degree in a test mode.

15. The apparatus as recited in claim 13, wherein the second period selector outputs the period-variable pulse signal when a self-refresh period is intended to automatically change depending on the temperature of semiconductor memory device.

* * * * *